US004001590B2

United States Statutory Invention Registration [19]

[11] Reg. Number: H1590

Douglass

[45] Published: Sep. 3, 1996

[54] PORTABLE AIRCRAFT INSTRUMENTATION DATA SIMULATOR

[76] Inventor: Darrell C. Douglass, 240 W. Rader Ave., Ridgecrest, Calif. 93555

[21] Appl. No.: 872,475

[22] Filed: Apr. 23, 1992

[51] Int. Cl.[6] ..... G06F 3/00

[52] U.S. Cl. ..... 395/500; 371/20.1; 375/224

[58] Field of Search ..... 395/500, 500 MS File; 371/20.1, 20.4, 29.5

[56] References Cited

U.S. PATENT DOCUMENTS

| | | | |
|---|---|---|---|
| 4,453,229 | 6/1984 | Schaice | 395/575 |
| 4,719,459 | 1/1988 | Kovacs | 371/20.1 |
| 4,760,329 | 7/1988 | Andreano | 371/15.1 |
| 4,763,124 | 8/1988 | Kovacs et al. | 340/825.8 |
| 4,847,838 | 7/1989 | Kralik | 371/29.5 |
| 4,905,172 | 2/1990 | Randle | 371/20.1 |
| 5,111,450 | 5/1992 | Cooledge et al. | 371/29.5 |
| 5,148,434 | 9/1992 | Richardson | 371/27 |
| 5,151,903 | 9/1992 | Mydill et al. | 371/27 |
| 5,223,788 | 6/1993 | Andreano et al. | 371/15.1 |

*Primary Examiner*—Bernarr E. Gregory

[57] ABSTRACT

A mobile and portable apparatus for providing multiplexed simulated 1553 data bus information for ground checkout of selected aircraft instrumentation. The apparatus can be powered by an onboard battery or by external power. Simulated 1553 data can be supplied at full and one-half speed. Data is stored in an E-PROM and is provided to appropriate data buses via a customized integrated circuit controller.

7 Claims, 5 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

PORTABLE AIRCRAFT INSTRUMENTATION DATA SIMULATOR

BACKGROUND OF THE INVENTION

The present invention is an aircraft instrumentation data simulator. More particularly the present invention simulates full and half-speed 1553 data bus information for ground checkout of aircraft instrumentation.

Aircraft instrumentation using MIL-STD-1553 data buses require simulation of bus traffic to check out on-board instrumentation. The bus traffic messages are specific due to ID codes and data values. There are large and heavy commercial 1553 simulators that require 110 volt AC power and a great deal of programming setup. These commercial units are also quite costly and typically do not offer the operating outputs, such as half-speed 1553 data rates required for checkout of older aircraft systems. The cost of a commercial simulator is usually in the thousands of dollars.

SUMMARY OF THE INVENTION

It is thus an object of the present invention to simulate full and half-speed 1553 bus traffic to permit ground check-out of onboard aircraft instrumentation without having to turn-on and private aircraft systems, such as onboard mission computers communicating with the remote terminals, such as, weapon on station, radar unit, flight controls, etc.

It is yet another object of the present invention to provide a ground simulator to provide a means of quick checkout and turnaround of aircraft flight test requiring no programming during operation.

It is still another object of the present invention to provide a low-cost, mobile and completely portable 1553 data simulator which can be operated on external power or self-contained battery power.

The present invention, the data Simulator, is a hand-held device that provides simulation of bus traffic, that is, MIL-STD-1553 messages to an aircraft or similar multi-functional system where it is desired to perform checkout of on-board instrumentation. The invention uses a pre-programmed E-PROM which is located in a socket on top of the device. It operates on either battery or external AC power and is completely portable. A memory E-PROM contains all the words required from the device including command, status, and data words. A customized IC SIM controller provides the words from memory at full or selectable one-half clock speed to an output data driver and then via the user operated rotary witch output to each of the data busses to which the remote terminals are connected.

BRIEF DESCRIPTION OF THE DRAWINGS

Other objects, advantages, and features of the present invention will be apparent from the detail description which follows when considered in conjunction with the accompanying drawings in which.

DETAILED DESCRIPTION

Figure 1:
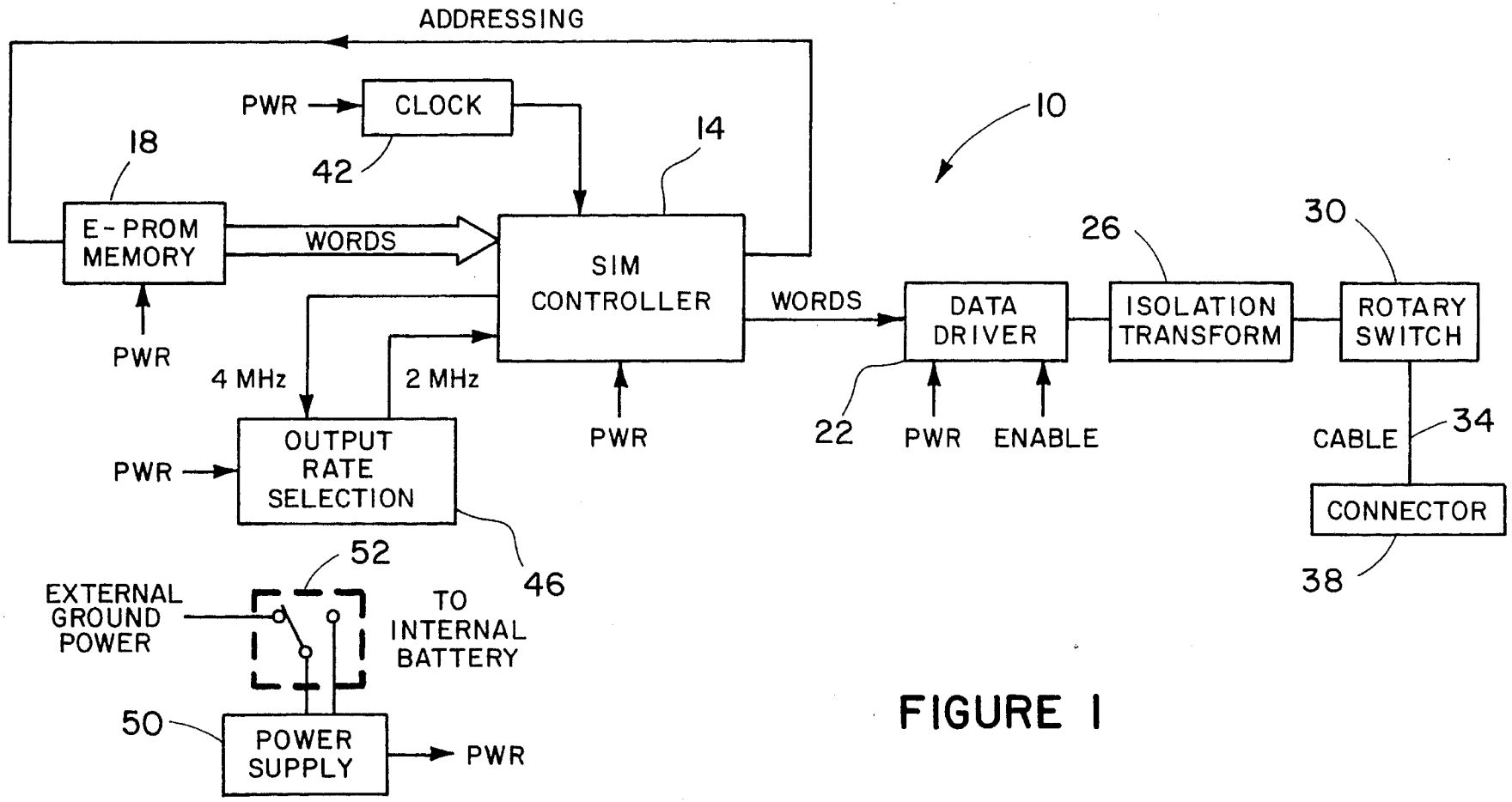
FIG. 1 is a functional block diagram of the present invention.
Figure 2:
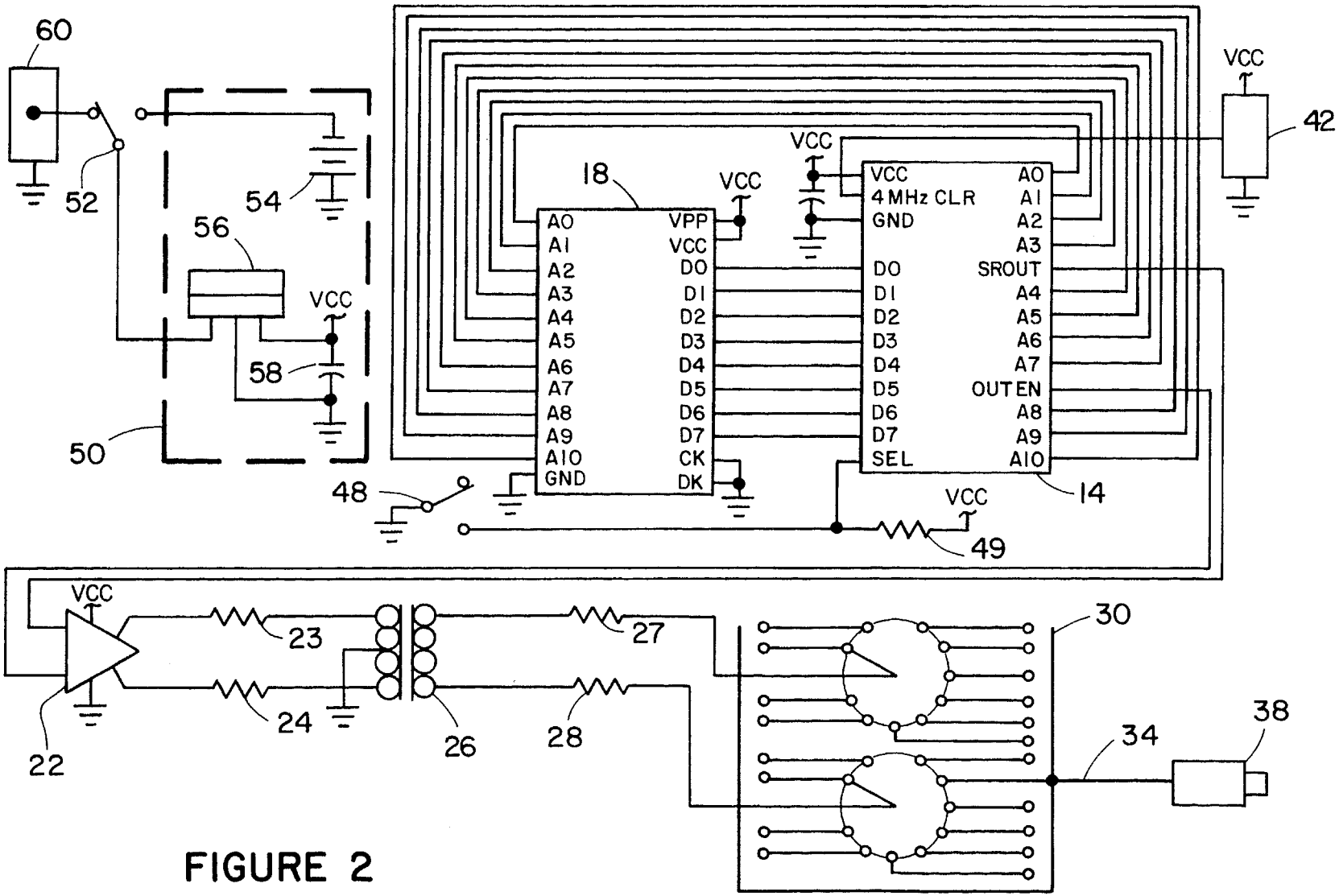
FIG. 2 is a schematic block diagram of the present invention.

Referring to FIGS. 1 and 2, the present invention, the data simulator 10 is comprised of the SIM controller 14, a programmable integrated circuit device which is connected for its input to the E-PROM memory 18 to obtain stored words consisting of commands, data, and status information. The controller 14 output is connected to the data driver 22 for converting its TTL digital signals to a differential positive and negative signal output usable by the remote terminals exercised by the data simulator 10. The data driver 22 is connected to provide its output to the isolation transformer 26 through the impedance matching resistors 23 and 24. The transformer 26 is connected to the rotary switch 30 through the impedance matching resistors 27 and 28. Simulator Differential Outputs from the rotary switch 30 are coupled with the shielded cable 34 to the connector 38 for coupling the MUX simulator 10 signals to the buses in the recipient system being subjected to ground checkout. The clock 42 provides clock signals to the SIM controller 14 and the controller 14 determines output rate by the manually selectable output rate selection 46 via the switch 48 for production of a one-half rate clock signal. The pullup resistor 49 connects between the normally open side of the switch 48, controller 14, input selector output rate pin and the supply voltage Vcc. The power supply 50 has a manual switch 52 mounted on the MUX simulator 10 housing to permit selection of external power via external power connector 60 or power from an internal battery 54. An internal 9V battery is used in one preferred embodiment of the invention.

Figure 3:
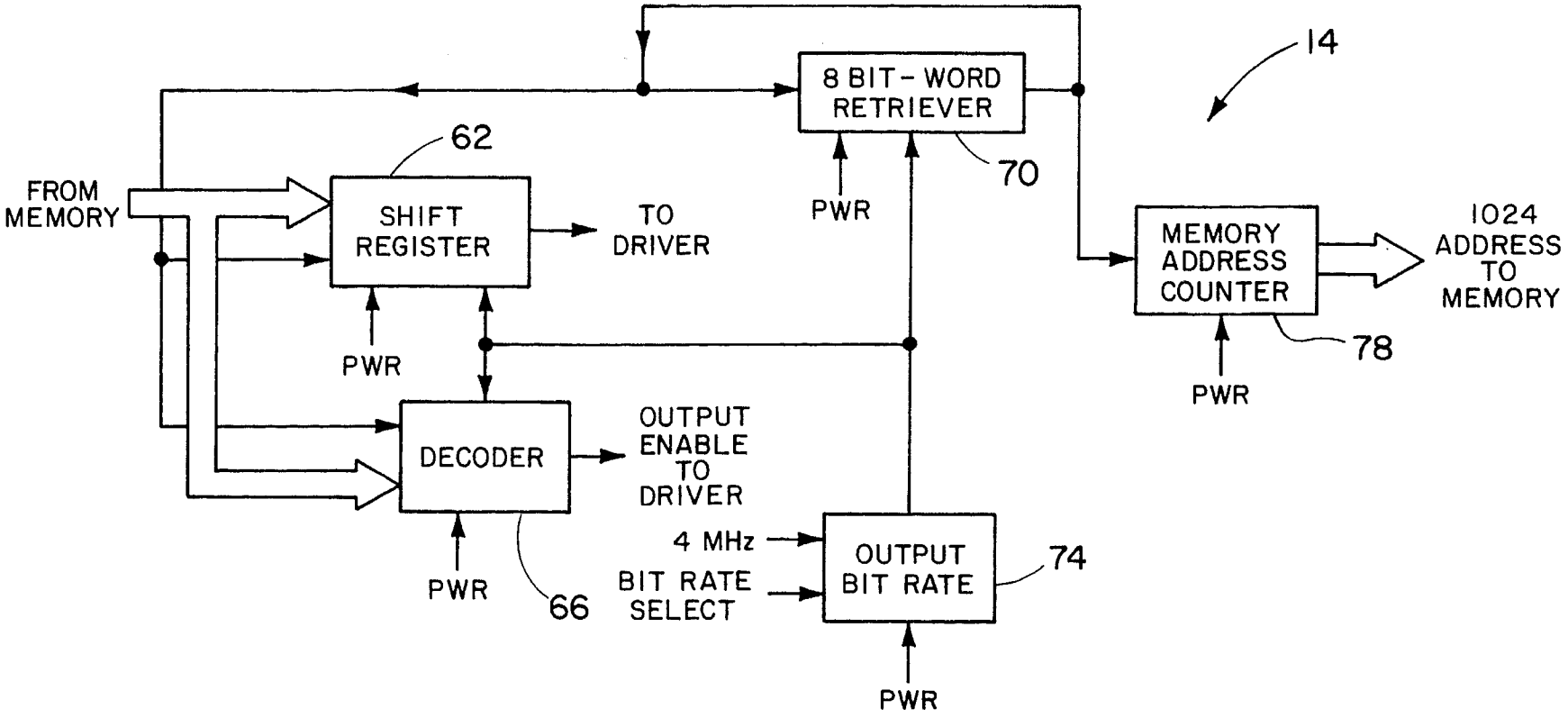
FIG. 3 is a functional block diagram of the SIM controller internal functions.
Figure 4:
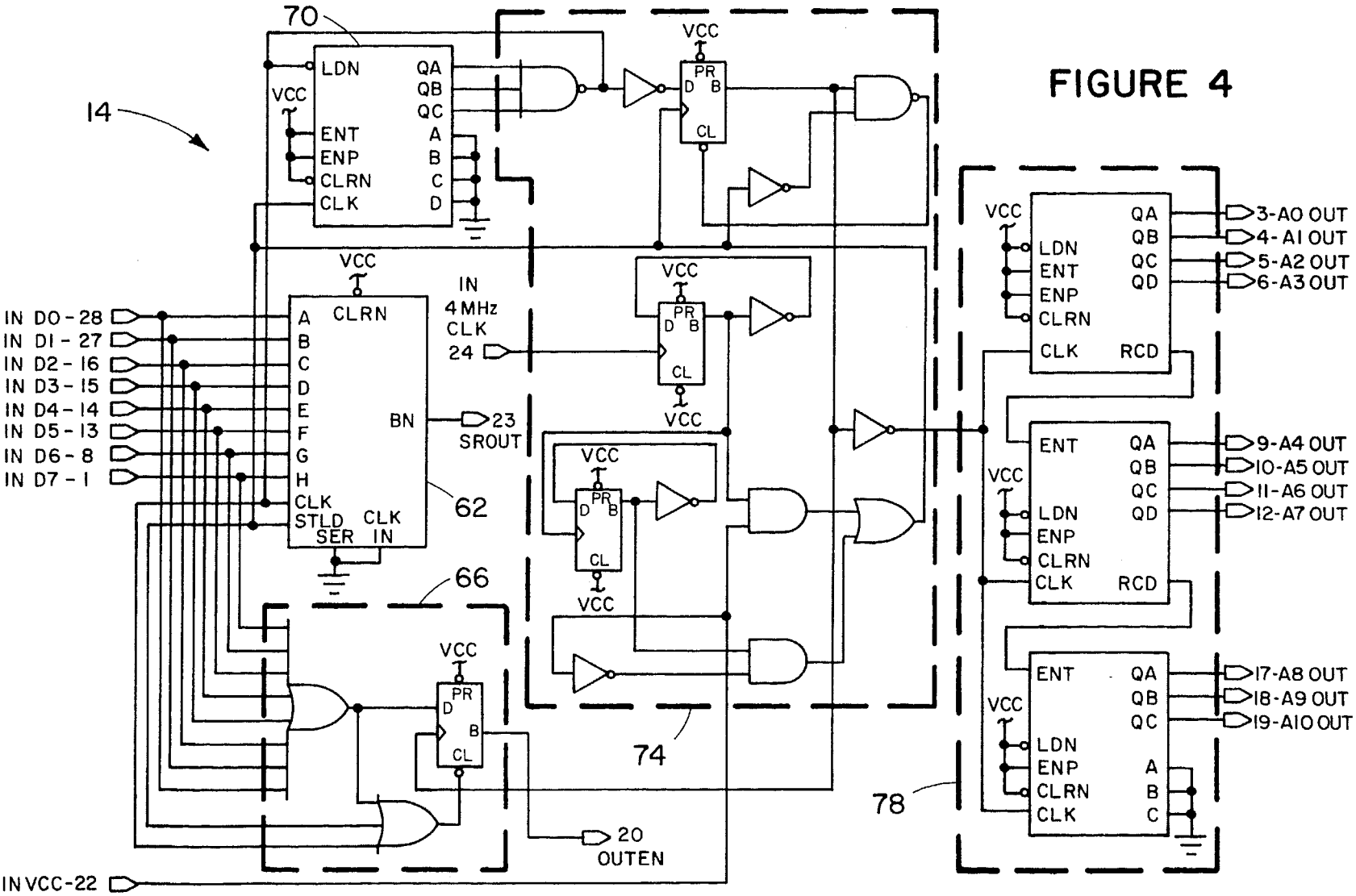
FIG. 4 is a schematic block diagram of the SIM controller function circuitry.

A more detailed description of the SIM controller 14 will be more clearly understood by referring to FIGS. 1 and 3. The SIM controller 14 uses a programmable integrated circuit device made by Altera Corporation of California. The chip's internal connection to achieve the desired configuration for a particular application and specifically for the present invention as hereinafter described are accomplished by user computer aided design. Thus, the internal circuitry of the chip was designed and programmed by the inventor. The specific connections internal to the chip are shown in FIG. 4 while the functional connections are shown in FIG. 3. Thus, the SIM controller 14 according to FIG. 3 and for a preferred embodiment of the present invention is comprised of the shift register 62 which is connected to E-PROM memory 18 for input and connected to data driver 22 to provide serial output. The decoder 66 is connected to receive word inputs from memory in 8 bit parallel form and provide an output enable to the data driver 22.

The eight bit counter 70 is connected to the memory address counter 78 which addresses up to 1024 memory locations and to the shift register 62 and the decoder 66. The output bit rate 74 provides the user selectable full bit rate or one-half bit rate, which in a preferred embodiment were 4 Mhz and 2 Mhz, respectively.

It should be noticed that in the preferred embodiment described, the Altera chip comprising the SIM controller 14 is shown in FIG. 4 as a number of interconnected discrete devices. Above each, where appropriate, the Altera system identifies the device numbers for each discrete equivalent. The E-PROM memory 18 was an MD2716 integrated circuit. The data driver 22 was a Dip IC DS3696 and the isolation transformer is a DDC model 27765 MIL-STD-1553 data bus isolation transformer.

Figure 5:
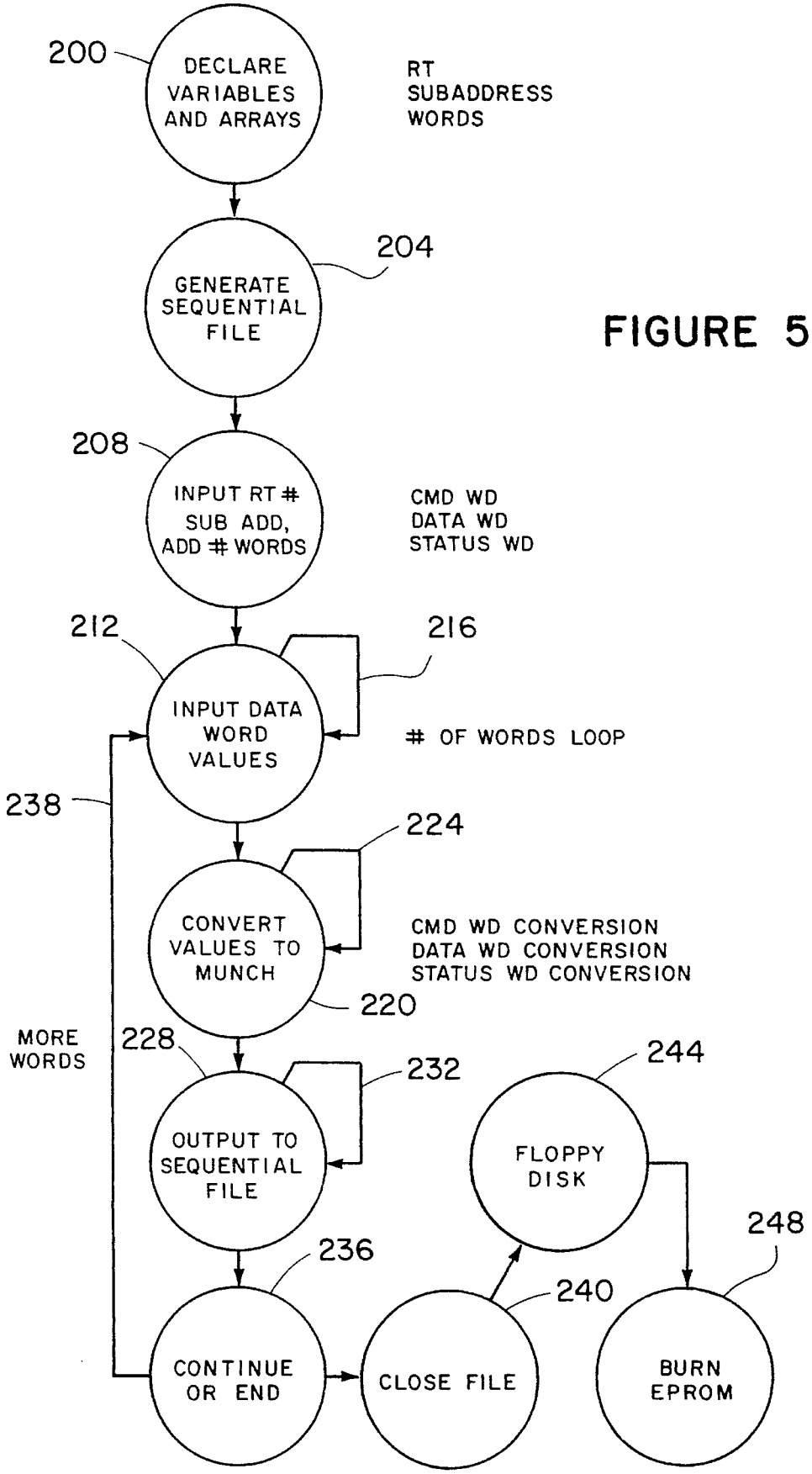
FIG. 5 is a flow diagram of steps required to program the E-PROM of the present invention.

Referring to FIG. 5, the methodology for preparing the E-PROM memory 18 is presented. First, declare variables and arrays is performed for remote terminals, sub-addresses, and words. Next the sequential file is generated at 204. At 208 inputs are made for remote terminal numbers, sub-addresses, and number of words for command, data, and status words. At 212 data word values are input, a value for each word in accordance with loop 216. The (original) code of each word value is converted to Manchester code at 220 a word at a time via the loop 224 for each command, data, and status word which is then output to sequential file 228 a word at a time at loop 232. The preparation of words for memory storage either continues or ends at 236. If more words are required the process reverts via 238 to the input step at 212. If the process is to end the file is closed at 240 and stored on a floppy disk at 244. The coded words thus prepared are finally burned into the E-PROM memory 18 at the step designated 248 in FIG. 5.

OPERATION

Once the E-PROM memory 18 has been loaded with the appropriate words required to simulate buss traffic to the remote terminals being checked out, the data simulator 10 can be readied for operation.

The data simulator 10 is contained in a lightweight, portable housing. The user first engages the connector 38 to a mating connector at the aircraft or system being subjected to ground checkout. Next, depending on the particular system being checked out, the user manually operates the output rate selection 46 to choose between full or half clock rate. In the case of the preferred embodiment discussed herein the selection is either 4 Mhz or 2 Mhz. The user can select which busses in the system being checked out the two-wire positive and negative Manchester II biphase coded commands, data words and status words are sent to by means of the rotary switch 30. The positive outputs are connected to one of the two switch elements in rotary switch 30 for primary and secondary connections to each bus accommodated. Similar connections of negative output are made via the second switch element in rotary switch 30. The user then simply selects external ground power or internal 9V transistor battery power using the power selector switch 52 located on the simulator housing.

Internal to the SIM controller 14, when the user selects the clock rate, either full or half-frequency by using the output rate select switch 48.

Referring to FIG. 4, the 8 bit counter 70 counts from 0 to or eight counts, one count for each clock pulse. After every eighth pulse it resets. At the time of each reset it causes the shift register 62 to reload another eight bit word received in parallel from the address (one of 1024 possible) in E-PROM memory 18 specified by the memory address counter 78 and to cause the decoder 66 to provide an output enable signal to the data driver 22. During the same 8 bit clock cycle the previously stored eight bit word is serially provided as the shift register 62 output which upon reaching the data driver 22 simultaneously with an output enable signal is the output word of the driver. Thus, once the MUX simulator 10 receives power and the clock rate is selected for the particular system checkout, the command, status, and data words in memory are continually provided as an output to the remote terminal busses to which the invention is connected.

FIG. 5 is a flow diagram showing the steps for preparing the sequential word file for E-PROM storage.

First at 200, variables including remote terminal numbers (RT#) for each of the terminals up to 32, sub-addresses, and words are declared as variables and arrays are established. At 204 a sequential file is generated and at 208 remote terminal numbers, sub-addresses and numbers of command, data, and status words are input.

At 212 values for each data word are entered, a value for each data word in sequence as indicated by the loop 216 until values for the full number of words as specified at 208 have been entered.

The values of the command, status, and data words are sequentially converted from binary code to Manchester code at 220, a word at a time per the loop 224. The Manchester code for each word is output to the sequential file at 228, a word at a time via the loop 232. The inputting of word values continues or ends at step 236, continuing via loop 238 or ending via the close file step at 240. At this point the closed file at step 240 is stored on a floppy disk at 244 or equivalent storage media until an EPROM is burned with the file data at 248.

It is thought that the present invention and many of its attendant advantages will be understood from the foregoing description and it will be apparent that various changes may be made in the form, construction and arrangement of the parts thereof without departing from the spirit and scope of the invention or sacrificing all of its material advantages, the form hereinbefore described being merely an exemplary embodiment thereof.

What I now claim as my invention is:

1. An apparatus for supplying simulated MIL-STD 1553 to data bus traffic for instrumentation checkout, comprising:

an E-PROM for providing non-volatile digital memory;

a user-configured electronically internally connected logic device for controlling the reading of E-PROM data values and providing synchronous TTL serial output data;

a means for receiving TTL signals and producing a positive and negative differential output;

a means for switching and coupling output to a 1553 bus; and a means for providing synchronous clocking to said controlling means.

2. The apparatus of claim 1 wherein said means for providing synchronous clocking includes a means for producing a fractionally reduced clocking frequency.

3. The apparatus of claim 2 wherein said means for producing a fractionally reduced clocking frequency produces a half-speed clock frequency.

4. The apparatus of claim 1 further comprising a means for providing user-selectable internal battery or external power.

5. The apparatus of claim 1 wherein said means for switching and coupling output to a MIL-STD 1553 data bus comprises:

a rotary switching means for selecting apparatus output via redundant lines to a MIL-STD 1553 data bus; and a means for connecting said redundant lines to said instrumentation.

6. The apparatus of claim 5 further comprising an impedance matching and coupling means connected between said means for receiving said TTL signals and producing a positive and negative differential output and said rotary switching means.

7. The apparatus of claim 1 wherein said means for controlling addressing of words from memory and providing synchronous TTL serial output data comprises:

a means for addressing said memory means;

a means for converting digital words received from said memory means from parallel to serial format;

a means for controlling output bit rate; and a means for decoding digital words obtained from said memory means and controlling an output enable to separate MIL-STD 1553 data bus messages output from said apparatus.

* * * * *